United States Patent [19]

Levine

[11] 4,412,190

[45] Oct. 25, 1983

[54] APPARATUS FOR PROCESSING CCD OUTPUT SIGNALS

[75] Inventor: Peter A. Levine, Trenton, N.J.

[73] Assignee: RCA Corporation, New York, N.Y.

[21] Appl. No.: 318,350

[22] Filed: Nov. 5, 1981

[51] Int. Cl.³ .................... H03H 17/00; H03H 7/01
[52] U.S. Cl. .................................. 333/165; 333/167; 358/167; 377/78; 357/24
[58] Field of Search ............... 333/165, 166, 167, 173; 357/24 R, 24 LR; 358/8, 11, 21 R, 36–38, 41, 44, 49, 166, 167, 213; 377/77–79; 328/167; 307/520–523; 329/50, 102, 109

[56] References Cited

U.S. PATENT DOCUMENTS 4,145,721 3/1979 Beaudouin et al. ............... 358/213
4,330,753 5/1982 Davy ...................................... 329/50
4,360,791 11/1982 Norris et al. ....................... 333/165

OTHER PUBLICATIONS

"Synchronous Demodulation Explained", Electronics Magazine, Apr. 7, 1981, at p. 125.

Primary Examiner—Marvin L. Nussbaum
Attorney, Agent, or Firm—E. M. Whitacre; W. H. Meise; H. I. Steckler

[57] ABSTRACT

CCD devices, such as imagers, typically have built in MOSFET output amplifiers with a large amount of 1/f noise. Instead of using the baseband video output signal, the present invention uses video signal sidebands centered about the C-register clock frequency or a harmonic thereof for improved S/N. An integrator and a gate are used to still further improve the S/N.

7 Claims, 3 Drawing Figures

APPARATUS FOR PROCESSING CCD OUTPUT SIGNALS

BACKGROUND OF THE INVENTION

The present invention relates to apparatus for processing CCD (charge coupled device) output signals, and more particularly, to such devices that have an integrated MOSFET (metal oxide semiconductor field effect transistor) amplifier.

When using a CCD imager, the output signal is derived from a clocked "C" register. The output charge signal generally is sensed with a low capacitance floating diffusion or gate to generate a voltage change which is buffered by a MOSFET amplifier which is integrated onto the same chip as that in which the imager is formed. However, such transistors have a large 1/f noise, i.e., the noise energy per unit of bandwidth increases as frequency decreases. In particular, this noise is especially troublesome from D.C. to a few kilohertz and causes random streaks in the displayed image.

It is therefore desirable to process the output signal from a CCD device to maximize the signal-to-noise ratio, which thereby reduces streaking in the displayed image if said device is an imager.

SUMMARY OF THE INVENTION

Method and apparatus for processing a sampled signal having a sampling frequency and harmonics thereof, a predominantly low frequency relative to the sampling frequency noise component, and a baseband component, comprising band pass filtering said sampled signal about said sampling frequency or a harmonic thereof to produce a filtered signal, and frequency converting said filtered signal to a baseband signal; whereby the signal-to-noise ratio of said baseband signal is improved with respect to the signal-to-noise ratio of said baseband component of said sampled signal.

DETAILED DESCRIPTION

Figure 1:
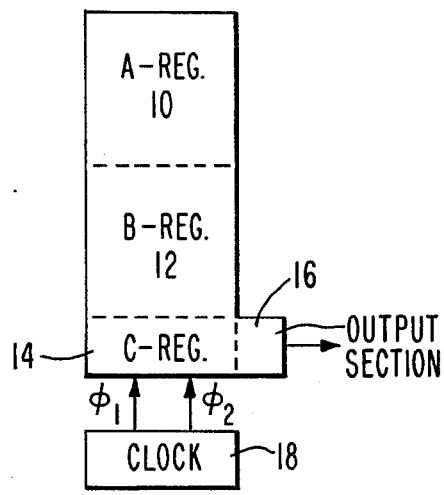
FIG. 1 is a symbollic drawing of a prior art CCD imager.

FIG. 1 shows a CCD imager for use with the invention. It will be assumed that it is a two phase device, although the invention can be used with three or four phase imagers. In general, it comprises A, B and C registers 10, 12, and 14, respectively and an output section 16. A-register 10 comprises a matrix of photosensitive elements that receive radiant photon energy, such as light, from a scene being viewed (not shown). Charge proportional to the energy intensity is generated by the photons, and the accumulated charge is stored for somewhat less than one television field period. During the vertical blanking interval, the accumulated charge is transferred in columns from A-register 10 to B-register 12 under the control of a clock signal (source not shown). During horizontal blanking, one horizontal line of charges at a time is parallel shifted into C-register 14 under the control of a clock signal (source not shown). During the next active portion of the horizontal line time, the charge packets are serially read out from output circuit 16 under the control of a two phase clock signal from source 18, which can have output signals (shown as $\phi_1$ and $\phi_2$ in FIG. 3a) having a frequency of, e.g. 6 MHz. During the next horizontal blanking interval another horizontal line is parallel shifted into C-register 14 from B-register 12, etc. Eventually all lines stored in B-register 12 are shifted into and then read out from C-register 14. B-register 12 is now ready to receive another field of charges from A-register 10, which charges A-register 10 has been accumulating.

Figure 2:
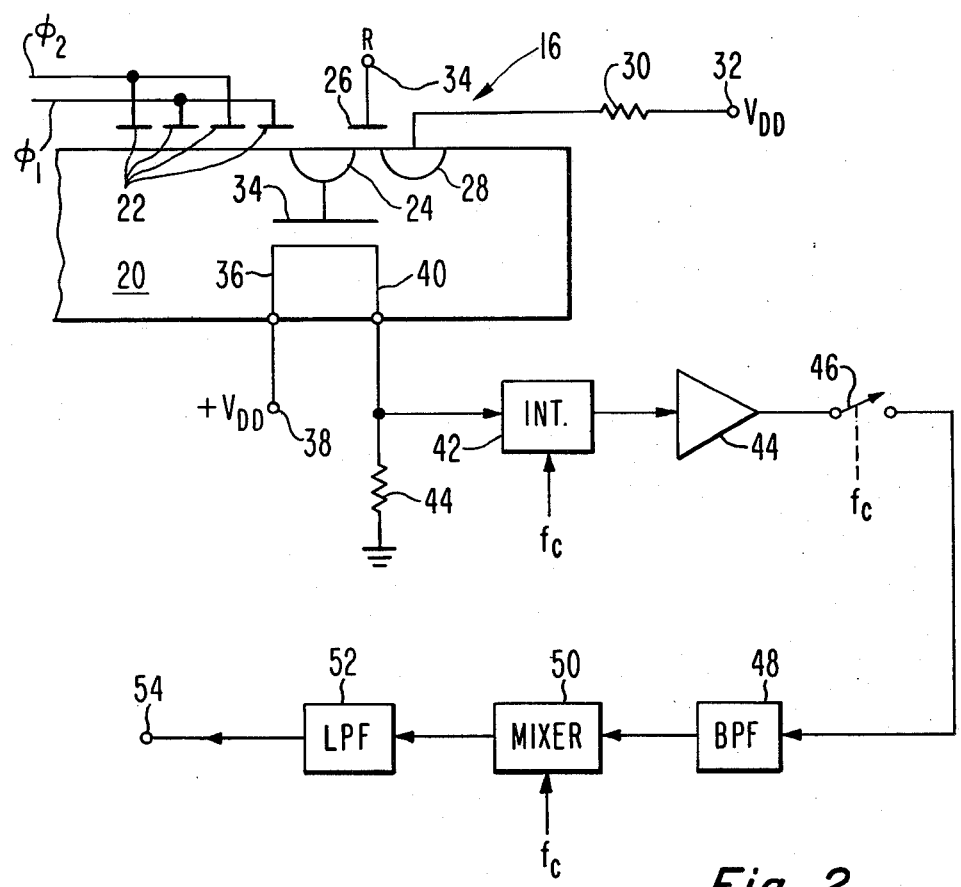
FIG. 2 is a partly cross-sectional view of a portion of the imager of FIG. 1 and a partly block diagram of a signal processing circuit in accordance with the invention.

FIG. 2 shows in its upper left hand portion details of the right end of C-register 14 (shown as a surface channel device, but a buried channel device can also be used) and output circuit 16. A P-type substrate 20 (assuming an N-channel CCD) has disposed above it a plurality of electrodes 22, alternate ones of which electrodes 22 receive the mutually out of phase clock signals $\phi_1$ and $\phi_2$. Said plurality extends to the left for substantially the entire length of substrate 20. Under the control of the clock signals, the charge packets (not shown) are shifted to the right. When $\phi_1$ goes low at times $t_4$, $t_9$, $t_{14}$, $t_{19}$, etc., a packet is almost instantaneously shifted to a floating diffusion 24 of output circuit 16. Diffusion 24 serves as a source electrode of an FET comprising reset gate 26 and reset drain 28. Drain 28 is connected to positive (for an N-channel CCD) source (not shown) of voltage $V_{DD}$ through an optional polarity reversal protection resistor 30 of about 10K ohms connected to terminal 32. Gate 26 receives from terminal 34 reset signal R, shown in FIG. 3b. When signal R is low between $t_3$ and $t_7$, $t_8$ and $t_{12}$, etc., charge may be shifted into and stored on diffusion 24. When signal R is high between $t_2$ and $t_3$, $t_7$ and $t_8$, etc., diffusion 24 is reset through a conducting channel thereby formed in substrate 20 to reset drain 28.

Figure 3:
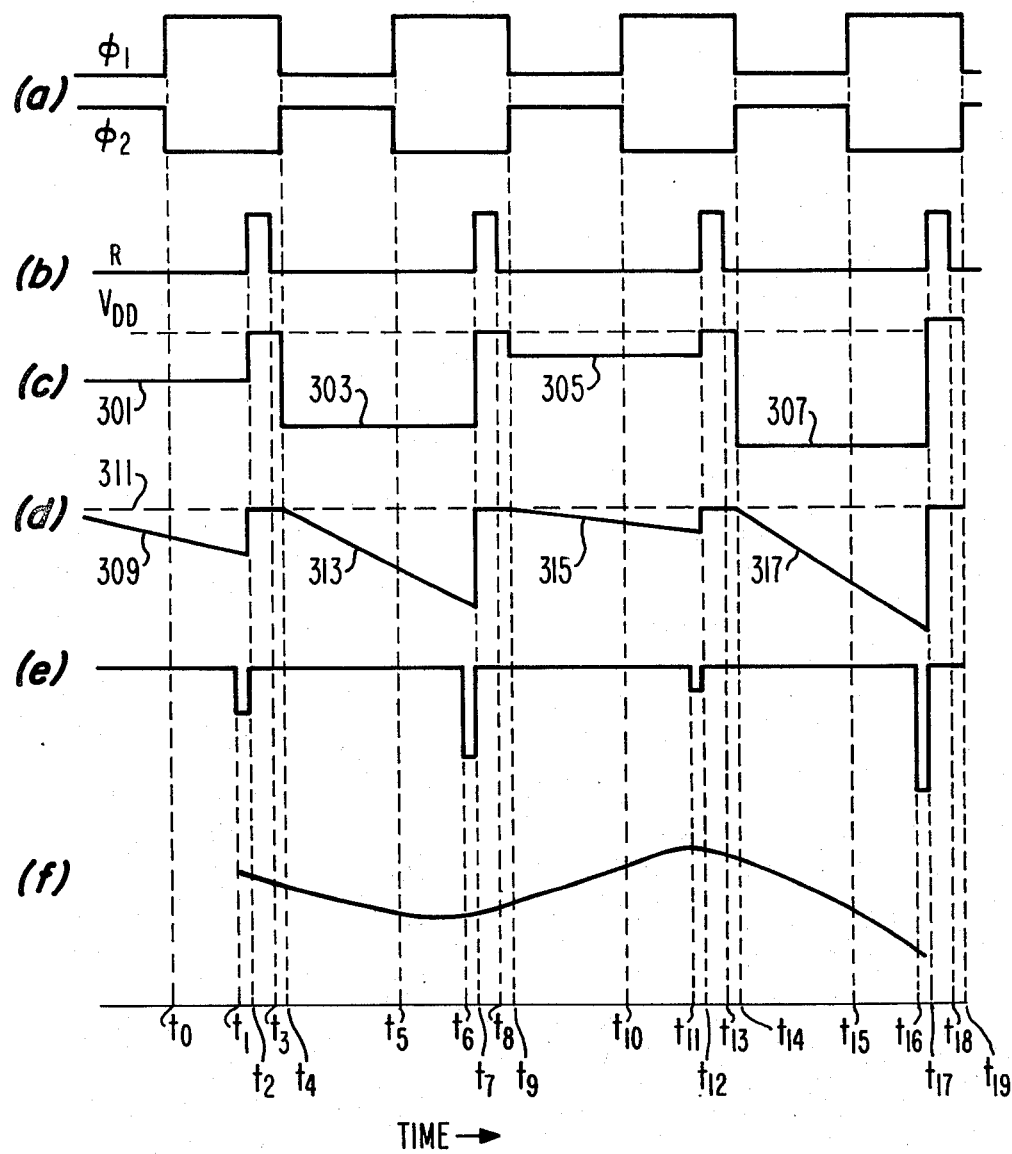
FIG. 3 shows waveforms that occur in FIG. 2.

The CCD output signal can be provided from diffusion 24, although it is at such a low level that in a practical embodiment a buffer amplifier (described below) is required to provide the lowest possible capacitance loading on diffusion 24. The frequency spectrum of the output signal comprises a baseband video signal, and video signal sidebands centered at the frequency of the clock signal from clock 18 and at harmonics of the clock signal frequency. In addition, there is an amplitude envelope function of the output signal of the form sin x/x, wherein x is a function of the time the output signal is held on diffusion 24. In particular, if signal R occurs just after signal $\phi_1$ goes low (which is permissible since it will be recalled that the charge packet is transferred almost instantaneously to diffusion 24), the first zero of the sin x/x function is high compared with the clock 18 output signal frequency. However the amplitudes of each of the video sidebands is then low, thus the S/N (signal-to-noise ratio) is also low (the noise is primarily generated in the amplifier as is explained below). The trailing edge of reset signal R, e.g. $t_3$, $t_8$, etc., must at the latest occur when $\phi_1$ is still high and just before signal $\phi_1$ goes low again, e.g., $t_4$, $t_9$, etc., to avoid having the transferred charge go to directly drain 28, thus preventing an output signal from being provided. When the trailing edge of signal R does occur just before signal $\phi_1$ goes low, then the sin x/x function decreases rapidly with increased in frequency. Since as explained below, it is the video signal sideband centered about the clock frequency or a harmonic thereof that is used is the present invention, it might be thought that the S/N would be low. However, the absolute amplitude of the video signal sidebands centered about the clock frequency which are the sidebands used in the embodiment described herein, might be high. Further an integrator (described below) has a longer possible integration time when reset pulse R occurs just before the $\phi_1$ clock signal goes low, thereby raising the S/N. For this reason, the reset signal R shown in FIG. 3b is shown as ending e.g. $t_3$, $t_8$, etc., just before signal $\phi_1$ goes low e.g. $t_4$, $t_9$, etc. It might be the situation that some other position of signal R would provide a better S/N for a particular embodiment, especially for a video signal sideband centered about some harmonic of the frequency of clock 18.

FIG. 3c shows the voltage at floating diffusion 24. When signal R occurs (goes high), e.g. $t_2$, $t_7$, etc. the voltage $V_{DD}$ present at terminal 32 is applied to diffusion 24 through a conductive channel in substrate 20. When signal R goes low e.g. $t_3$, $t_8$, etc., signal $\phi_1$ also goes low after a slight time delay, and therefore the electrons of the charge packet are transferred to diffusion 24 to lower the positive potential thereon by an amount proportional to the number of electrons in the charge packet, which in turn is proportional to the light incident upon that area of A-register 10 from which the particular charge packet was originally derived. This new lower voltage on diffusion 24, e.g. 301, 303, 305, and 307, is held until signal R goes high again, e.g. $t_2$, $t_7$, etc.

Since the number of electrons in a charge packet is relatively small, the diffusion 24 capacitance must be small to obtain a useable output voltage. Therefore, output section 16 comprises a MOSFET buffer amplifier comprising a gate 34 connected to diffusion 24, a drain 36 connected by way of terminal 38 to a source of positive voltage $V_{DD}$, and a source 40 coupled to integrator 42 and to ground through a resistor 44. It will be appreciated that such a configuration forms a source follower. In general, resistor 44 should be small for a large bandwidth; however, since it forms a voltage divider with the internal resistance of the MOSFET, which divider reduces the output voltage, it should not be too small. A problem with the MOSFET is that it has a large amount of 1/f noise, i.e. the noise energy per unit of bandwidth increases with decreasing frequency. The present invention is directed at substantially avoiding the effects of this problem.

The output signal from the source follower is integrated by sampling integrator 42. (If desired, an amplifier can be placed between resistor 44 and integrator 42.) Thus voltage 301 of FIG. 3c is integrated to become line 309 of FIG. 3d. Integrator 42 also receives a reset signal having the same frequency as that of the C-register clock $f_c$. (If desired the reset signal R can be used as the sampling signal for integrator 42). During the occurrence of the integrator reset signal ($t_2$ to $t_4$, $t_7$ to $t_9$, etc.), the output signal from integrator 42 is set to a desired reference level 311. Next the voltage 303 is integrated to form waveform 313. Similarly voltages 305 and 317 form waveforms 315 and 317 respectively. The integrator 42 has a cut off frequency of about $f_c/2$ and tends to average out high frequency noise. Thus the S/N is increased. The output signal from integrator 42 is applied to amplifier 44 and then to gate 46. Gate 46 receives a narrow gating signal that occurs just before reset of gate 26, e.g. $t_1$-$t_2$, $t_6$-$t_7$, etc., to have the maximum signal output from integrator 42. Because the gating signal is narrow, the envelope function sin x/x (which the gating operation causes to occur, and which is distinct from the sin x/x envelope discussed above caused by clocking of the CCD imager), decreases slowly with increased frequency, leading to large amplitude high frequency components. Further, since the signal has been held on diffusion 24 and integrated for a relatively long time, high frequency noise is reduced.

The output signal from gate 46 is applied to BPF (band pass filter) 48. This filter is centered at the clock frequency $f_c$, and thus rejects most of the 1/f noise discussed above, which is prevalent in the baseband video signal. If desired it can be tuned to a harmonic of the frequency $f_c$, the output signal is then applied to mixer 50 that also receives a local oscillator (not shown) signal of frequency $f_c$. In general, if BPF 48 is tuned to $nf_c$, wherein n is an integer, the mixer must also receive a local oscillator signal of frequency $nf_c$. In any case, the now baseband frequency output signal of mixer 50 is applied to LPF (low pass filter) 52, which LPF rejects spurious output signals from mixer 50. The final output signal is available at output terminal 54 for further processing.

What is claimed is:

1. Apparatus for processing a sampled signal having a sampling frequency and harmonics thereof, a predominantly low frequency relative to the sampling frequency noise component, and a baseband component, said apparatus comprising a sampled integrator having an input means for receiving said sampled signal, a gate coupled to said sampled integrator, filtering means coupled to said gate for band pass filtering said sampled signal about said sampling frequency or a harmonic thereof to produce a filtered signal, and converting means for frequency converting said filtered signal to a baseband signal; whereby the signal-to-noise ratio of said baseband signal is improved with respect to the signal-to-noise ratio of said baseband component of said sampled signal.

2. Apparatus as claimed in claim 1, further comprising CCD imager means for providing said sampled signal, said imager means having at least a C-register, and a clock coupled to said register, and wherein said sampling frequency equals the clock frequency.

3. Apparatus as claimed in claim 2, further comprising a follower circuit integrated with said CCD imager means.

4. Apparatus as claimed in claim 1, wherein said filtering means comprises a band pass filter centered about said sampling frequency.

5. Apparatus as claimed in claim 1, wherein said converting means comprises a mixer, and a low pass filter coupled to said mixer.

6. Apparatus as claimed in claim 1, wherein said integrator and said gate each receive sampling signals having said sampling frequency.

7. Apparatus as claimed in claim 1, wherein said integrator has a cut off frequency of one-half the sampling frequency.

* * * * *